(12) United States Patent
Sdrulla et al.

(10) Patent No.: US 12,477,768 B2
(45) Date of Patent: Nov. 18, 2025

(54) SiC STATIC INDUCTION TRANSISTOR WITH DOUBLE SIDE COOLING AND METHOD OF MANUFACTURE

(71) Applicant: Analog Power Conversion LLC, Bend, OR (US)

(72) Inventors: Dumitru G. Sdrulla, Bend, OR (US); Amaury Gendron-Hansen, Bend, OR (US); Wang-Chang A. Gu, Bend, OR (US)

(73) Assignee: Analog Power Conversion LLC, Bend, OR (US)

( * ) Notice: Subject to any disclaimer, the term of this patent is extended or adjusted under 35 U.S.C. 154(b) by 470 days.

(21) Appl. No.: 18/311,159

(22) Filed: May 2, 2023

(65) Prior Publication Data
US 2024/0371989 A1 Nov. 7, 2024

(51) Int. Cl.
| | | |
|---|---|---|
| *H10D 30/00* | (2025.01) | |
| *H01L 23/373* | (2006.01) | |
| *H01L 23/528* | (2006.01) | |
| *H10D 12/01* | (2025.01) | |
| *H10D 62/832* | (2025.01) | |
| *H10D 64/64* | (2025.01) | |

(52) U.S. Cl.
CPC ....... *H10D 30/202* (2025.01); *H01L 23/3736* (2013.01); *H01L 23/5286* (2013.01); *H10D 12/031* (2025.01); *H10D 62/8325* (2025.01); *H10D 64/64* (2025.01)

(58) Field of Classification Search
CPC .............. H10D 30/202; H10D 12/031; H10D 62/8325; H10D 64/64; H01L 23/3736; H01L 23/5286
See application file for complete search history.

(56) References Cited

U.S. PATENT DOCUMENTS

| | | |
|---|---|---|
| 4,406,052 A | 9/1983 | Cogan |
| 2006/0060884 A1 | 3/2006 | Ohyanagi |
| 2016/0133736 A1 | 5/2016 | Morin |

(Continued)

FOREIGN PATENT DOCUMENTS

JP 2005158774 A 6/2005

OTHER PUBLICATIONS

Clarke, R. C. et al., SIC Static Induction Transistors, Final Report Office of Naval Research, Jan. 25, 1995, pp. 1-1 to 5-3, Westinghouse STC, Pittsburgh, Pennsylvania.

(Continued)

*Primary Examiner* — Mohammad A Rahman

(57) ABSTRACT

A silicon carbide (SiC) static induction transistor (SIT) includes a source, a gate disposed over the source and receiving a control signal, a drain disposed over the recessed gate and generating an output signal, an epitaxial pattern disposed between the source and the drain and including a protruding portion, and a gate bus electrically coupled to the gate and including carbon. A method of forming an SiC SIT transistor device includes providing a substrate including a source doped with dopants of a first conductivity type, forming an epitaxial pattern including a protruding portion over the source, forming a recessed gate over the source, forming a gate bus over the recessed gate, forming a drain over the gate bus and the epitaxial pattern, and forming a first heatsink over the drain.

20 Claims, 5 Drawing Sheets

(56) References Cited

U.S. PATENT DOCUMENTS

| | | |
|---|---|---|
| 2020/0066895 A1 | 2/2020 | Cheng |
| 2023/0019985 A1 | 1/2023 | Gendron-Hansen et al. |
| 2023/0021169 A1 | 1/2023 | Sdrulla et al. |
| 2023/0418319 A1* | 12/2023 | Potera .................... G01R 31/50 |

OTHER PUBLICATIONS

Henning J.P. et al., A Novel Self-Aligned Fabrication Process for Microwave Static Induction Transistors in Silicon Carbide, IEEE Electron Device Letters, Dec. 2000, pp. 578-580, vol. 21 No. 12, IEEE Xplore.

International Search Report and Written Opinion dated Aug. 21, 2024 for International Application No. PCT/US2024/026607.

* cited by examiner

SiC STATIC INDUCTION TRANSISTOR WITH DOUBLE SIDE COOLING AND METHOD OF MANUFACTURE

BACKGROUND

A conventional vertical SIT (static induction transistor) device has the current flow vertically between a source and a drain. In such a conventional SIT device, the drain is located at a lower portion of the transistor device, whereas a gate and the source are located at an upper portion of the device. When the source located at the upper portion of the device is grounded and accessed through wires, stray inductance associated with the grounded source may be relatively large, and RF performance of the device may be deteriorated.

The conventional SIT device for RF applications may generate a significant amount of RF power during its operation in a region around a source located proximate to a gate. In addition, when an RF power signal is output through a drain of the SIT device, the drain may not be directly connected to a heat removal element (e.g., a heatsink). Accordingly, it is desirable to effectively remove heat generated during the operation of the device while addressing these issues.

SUMMARY

Embodiments of the present disclosure relate to an SIT, an SIT device, and a method of forming the SIT device with double side cooling. In particular, embodiments of the present disclosure relate to a silicon carbide (SiC) SIT, an SiC SIT device, and a method of forming the SiC SIT device.

In an embodiment, a silicon carbide (SiC) SIT includes a source disposed under a top surface of the transistor, a gate disposed over the source and receiving a control signal, a drain disposed over the gate and generating an output signal, an epitaxial pattern disposed between the source and the drain and including a protruding portion, and a gate bus electrically coupled to the gate and including carbon.

In an embodiment, an SiC SIT device includes a first heatsink and a die disposed under the first heatsink. Such a die may include a source disposed under a top surface of the transistor device, a recessed gate disposed over the source and receiving a control signal, a drain disposed over the recessed gate and generating an output signal, an epitaxial pattern disposed between the source and the drain and including a protruding portion, and a gate bus electrically coupled to the gate and including carbon.

In an embodiment, a method of forming an SiC SIT device includes providing a substrate including a source that is doped with dopants of a first conductivity type, forming an epitaxial pattern including a protruding portion over the source, forming a recessed gate over the source, forming a gate bus over the recessed gate, forming a drain over the gate bus and the epitaxial pattern, and forming a first heatsink over the drain.

DETAILED DESCRIPTION

Embodiments of the present application relate to an SIT, an SIT device, and a method of forming the SIT device.

A detailed description of embodiments is provided below along with accompanying figures. The scope of this disclosure is limited by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

Figure 1:
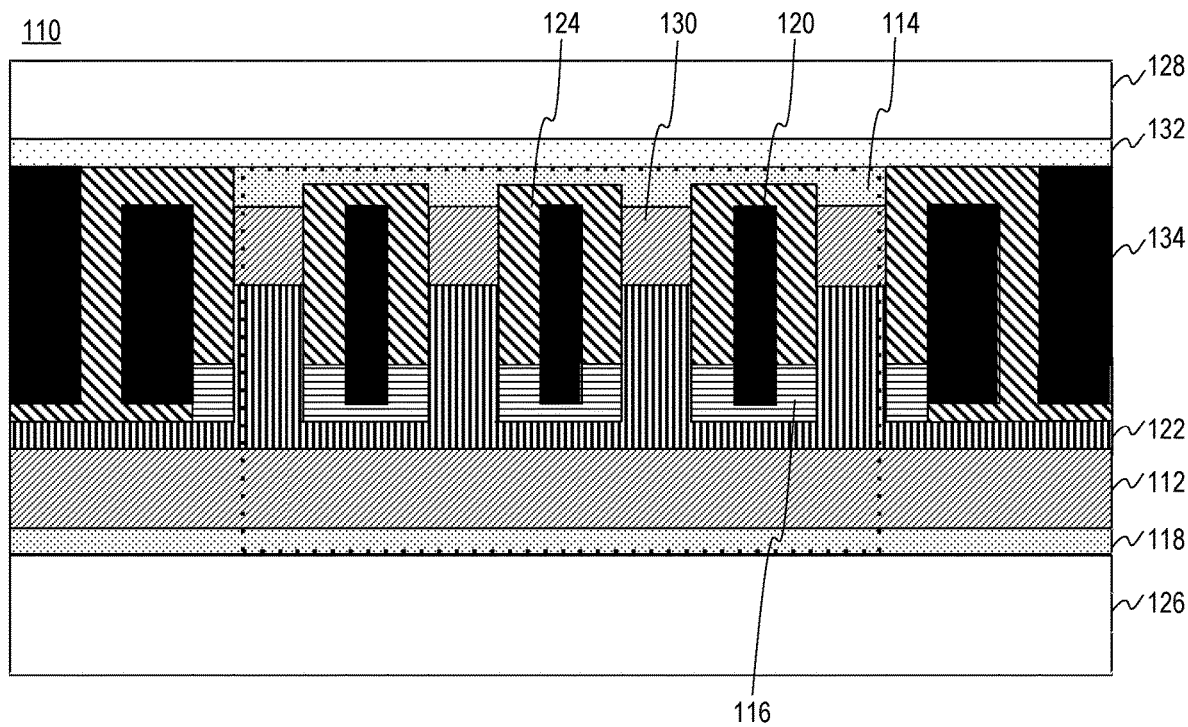
FIG. 1 illustrates a simplified cross-sectional view of an SiC SIT device according to an embodiment.

FIG. 1 illustrates a simplified cross-sectional view of an SiC SIT device 110 according to an embodiment. However, embodiments of the present disclosure are not limited thereto, and the transistor device may include other types of transistors in which a current flows substantially vertically between a source and a drain. For example, the transistor device may include a vertical JFET, a bipolar SIT, or the like.

Referring to FIG. 1, the transistor device 110 includes a source 112. The source 112 may be electrically grounded and disposed under a top surface of the transistor device 110. In an embodiment, the source 112 corresponds to at least a portion of a semiconductor substrate including dopants of a first conductivity type with a relatively high doping concentration. For example, the source 112 may correspond to at least a portion of an SiC substrate (e.g., N++ SiC substrate), and the SiC substrate may be crystallized as any suitable polytype (e.g., 2H, 4H, 6H, or 3C polytype).

The transistor device 110 in FIG. 1 further includes an epitaxial pattern 122 and gates 116 disposed between protruding portions (e.g., pillars) of the epitaxial pattern 122. Each of the gates 116 may receive a control signal to control an operation of the transistor device 110. In an embodiment, the gates 116 are recessed gates and disposed sufficiently proximate to the source 112 to make the transistor device 110 function properly as an SIT device. For example, the recessed gates 116 may be doped with dopants of a second conductivity type (e.g., P-type dopants).

The transistor device 110 in FIG. 1 further includes gate buses 120 for accessing the gates 116. In an embodiment, each of the gate buses 120 is electrically coupled to a corresponding one of the recessed gates 116. For example, each of the gate buses may extend from a recessed surface of the corresponding gate 116 beyond a bottom surface of a doped pattern (or a drain contact) 130. In an embodiment, each of the gate buses 120 includes carbon converted from an organic material (e.g., a photoresist) fabricated using processes, as will be described below in more detail with reference to FIG. 3H. As a result, the gate buses 120 each may be formed in a space defined by the dielectric pattern 124 and the recessed gate 116 with good filling characteristics.

The transistor device 110 in FIG. 1 further includes doped patterns 130, each of which is disposed over a corresponding one of the pillars of the epitaxial pattern 122. For example, the doped patterns 130 each may include dopants of the first conductivity type (e.g., nitrogen).

The transistor device 110 in FIG. 1 further includes an output electrode (e.g., a drain) 114 generating an output signal. The drain 114 in FIG. 1 is electrically coupled to the doped patterns 130 and disposed over dielectric patterns 124. For example, the drain 114 may be located at an upper portion of the transistor device relative to the source 112 and the recessed gates 116.

The transistor device 110 in FIG. 1 further includes an insulation layer 132 (e.g., BeO substrate) disposed between the drain 114 and a first heatsink (e.g., an upper cooling plate) 128 to electrically isolate the drain 114 from the upper cooling plate 128. In an embodiment, the upper cooling plate 128 covers a top surface and side surfaces of a die that includes the source 112, the gates 116, a conductive layer 118, the gate buses 120, the epitaxial pattern 122, the dielectric pattern 124, the drain 114, and the insulation layer 132, thereby providing a first cooling path and increasing a surface area of the first cooling path for effectively removing heat generated during an operation of the transistor device 110.

The transistor device 110 in FIG. 1 further includes the conductive layer (e.g., nickel silicide) 118 disposed under the source 112 and a second heatsink (e.g., a lower cooling plate) 126 disposed under the conductive layer 118. In an embodiment, the lower cooling plate 126 covers a bottom surface of the die in the transistor device 110, thereby providing a second cooling path for effectively removing heat generated during an operation of the transistor device 110.

The transistor device 110 in FIG. 1 further includes outer electrodes 134 disposed at end portions of the transistor device 110. In an embodiment, one or more of the outer electrodes 134 in FIG. 1 are electrically coupled to the source 112, and the coupled outer electrodes 134 each function as a field plate that provides a high-voltage termination, thereby increasing blocking voltage capability of the transistor device 110. For example, the outer electrodes 134 may include carbon and be fabricated similarly to the gate buses 120 to have good filling characteristics.

In a conventional transistor device, a source is located at an upper portion of the device and a drain is located at a lower portion of the device. In the conventional transistor device, the source is accessed through wires, leading to relatively large stray inductance and deterioration of RF performance of the device. In contrast, a transistor device (e.g., the transistor device 110 in FIG. 1) according to an embodiment of the present disclosure has a structure in which a source (e.g., the grounded source 112) is located at a lower portion of the device relative to a drain (e.g., the drain 114), gates (e.g., the recessed gates 116) are located proximate to the source, and gate buses (e.g., the gate buses 120) for accessing the gates extend from the gates, thereby obviating the need of accessing the source through wires. As a result, RF performance of such a transistor device according to an embodiment of the present disclosure may be improved compared to the conventional transistor device.

In addition, a transistor device (e.g., the transistor device 110 in FIG. 1) according to an embodiment of the present disclosure includes a first heatsink (e.g., the upper cooling plate 128 in FIG. 1) and a second heatsink (e.g., the lower cooling plate 126) that provide three-dimensional cooling of the transistor device 110 together for effectively removing heat generated from the transistor device 110 during its operation. For example, the upper cooling plate 128 and the lower cooling plate 126 in FIG. 1 include gold (Au) and the recessed gates 116 are P-type gates to withstand high operating temperatures (e.g., up to about 550° C.) of the transistor device 110.

Figure 2:
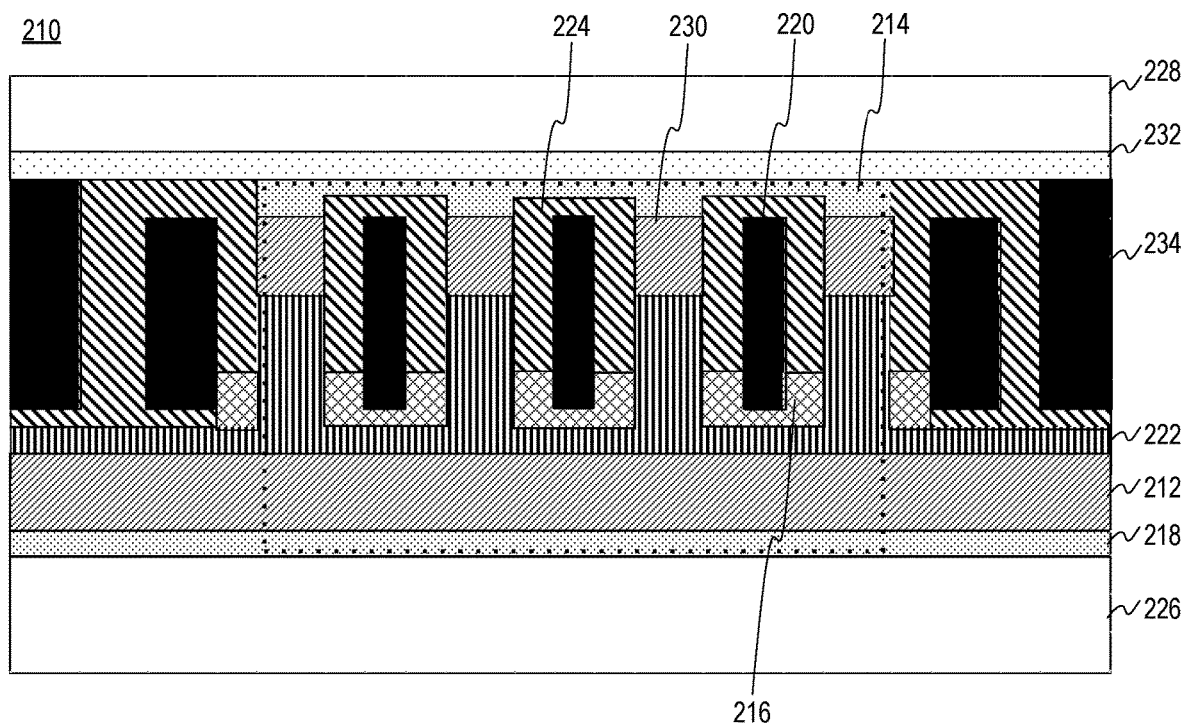
FIG. 2 illustrates a simplified cross-sectional view of an SiC SIT device according to an embodiment.

FIG. 2 illustrates a simplified cross-sectional view of a transistor device 210 according to an embodiment. The transistor device 210 in FIG. 2 includes similar elements to those of the transistor device 110 of FIG. 1, and thus detailed descriptions on these elements may be omitted in the following descriptions for the interest of brevity.

The transistor device 210 of FIG. 2 differs from the transistor device 110 of FIG. 1 in that the transistor device 210 includes Schottky barrier type gates 216, rather than the gates 116 doped with a specific type of dopants (e.g., the P-type gates). In an embodiment, the Schottky barrier type gates 216 includes various material according to operating temperatures of the transistor device 210. For example, the Schottky barrier type gates 216 may include TiW for low operation temperatures (e.g., in a range from 120° C. to 150° C.), Ti for intermediate operation temperatures (e.g., in a range from 175° C. to 200° C.), and Pt and Ni for high operation temperatures (e.g., Pt in a range higher than 225° C. and Ni in a range higher than 250° C.).

FIGS. 3A, 3B, 3C, 3D, 3E, 3F, 3G, 3H, 3I, and 3J illustrate a method of fabricating the transistor device 110 in FIG. 1 according to an embodiment. Specifically, FIGS. 3A, 3B, 3C, 3D, 3E, 3F, 3G, 3H, 3I, and 3J are simplified cross-sectional views of fabricating a middle portion (indicated by a dashed box in FIG. 1) of the transistor device 110.

Figure 3B:
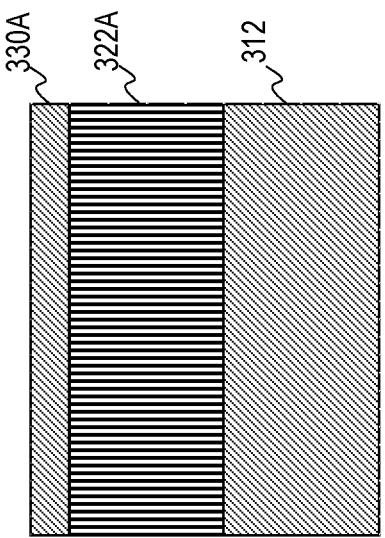
FIGS. 3A, 3B, 3C, 3D, 3E, 3F, 3G, 3H, 3I, and 3J illustrate a method of fabricating the transistor device in FIG. 1 according to an embodiment.
Figure 3D:
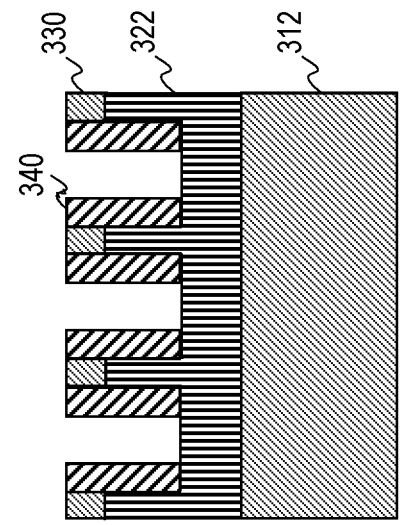
Figure 3A:
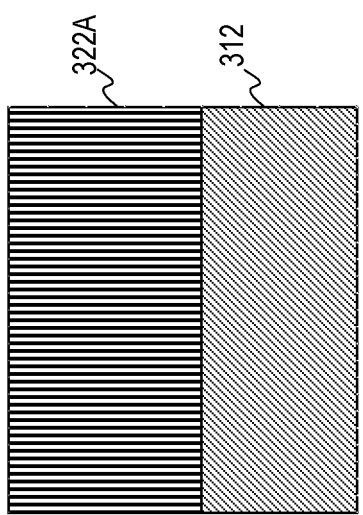

Referring to FIG. 3A, the method includes providing a silicon substrate (e.g., SiC substrate) 312. In an embodiment, the SiC substrate 312 is crystallized as a 4H polytype and includes dopants of a first conductivity type (e.g., N-type dopants) with a high doping concentration (e.g., N++ substrate). The method further includes growing an epitaxial layer 322A over the SiC substrate 312. In an embodiment, the epitaxial layer 322A is an N-type epitaxial layer.

Referring to FIG. 3B, the method includes forming a doped layer 330A with dopants (e.g., nitrogen) of the first conductivity type with a high doping concentration. In an embodiment, the doped layer 330A may be formed in an upper portion of the epitaxial layer 322A by ion implantation.

Figure 3C:
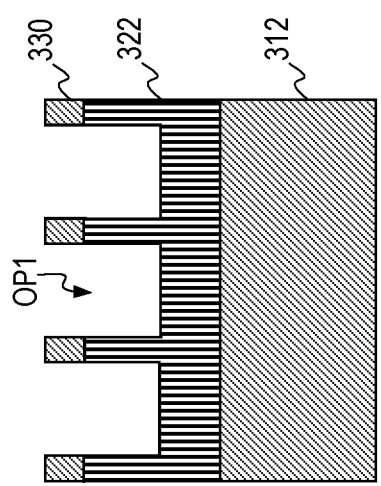

Referring to FIG. 3C, the method includes forming doped patterns (or drain contacts) 330 and an epitaxial pattern 322, such that an adjacent pair of protruding portions (e.g., pillars) of the epitaxial pattern 322 are spaced apart from each other by a first opening OP1 and a doped pattern 330 is disposed over a corresponding one of the pillars of the epitaxial pattern 322. In an embodiment, a mask pattern is formed over the doped layer 330A, and then an etching process (e.g., reactive ion etching) is performed to form the first openings OP1.

Referring to FIG. 3D, the method includes forming spacers 340 over sidewalls of the doped patterns 330 and sidewalls of the pillars of the epitaxial pattern 322. In an embodiment, a dielectric material (e.g., oxide or nitride) is formed over the resulting structure of FIG. 3C by a deposition process (e.g., sputtering or LPCVD), and then some portions of the dielectric material are selectively removed by an etching process to form the spacers 340.

Figure 3E:
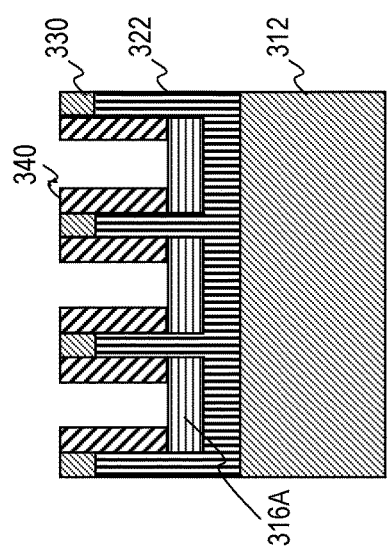

Referring to FIG. 3E, the method includes forming gate materials 316A between the pillars of the epitaxial pattern 322. In an embodiment, dopants of a second conductivity type (e.g., P-type dopants) are implanted into regions between adjacent pillars of the epitaxial pattern 322, and the implanted dopants are diffused at an elevated temperature to form the gate materials 316A in the epitaxial pattern 322 under the spacers 340.

Figure 3F:
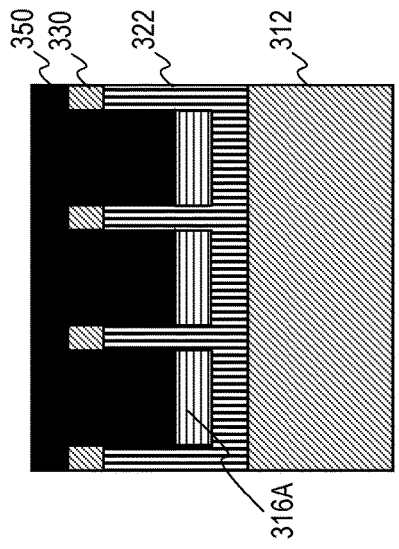

Referring to FIG. 3F, the method includes reducing step bunching defects on upper surfaces of the gate materials 316A, the sidewalls of the doped patterns 330, and the sidewalls of the pillars of the epitaxial pattern 322. In an embodiment, the spacers 340 are removed by an etching process, covering the remaining structure with a carbon layer 350 (e.g., a temperature-resistant carbon layer), and an anneal process at an elevated temperature is performed to reduce step bunching defects.

Figure 3G:
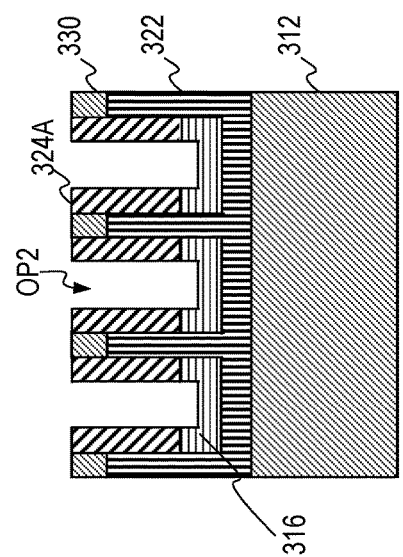

Referring to FIG. 3G, the method includes forming dielectric materials 324A and gates (e.g., recessed gates) 316 under the dielectric materials 324A. In an embodiment, the carbon layer 350 is removed, the dielectric materials 324A are formed over the sidewalls of the doped patterns 330 and the sidewalls of the pillars of the epitaxial pattern 322, and upper portions of the gate materials 316A are removed to form the recessed gates 316 and second openings OP2.

Figure 3H:
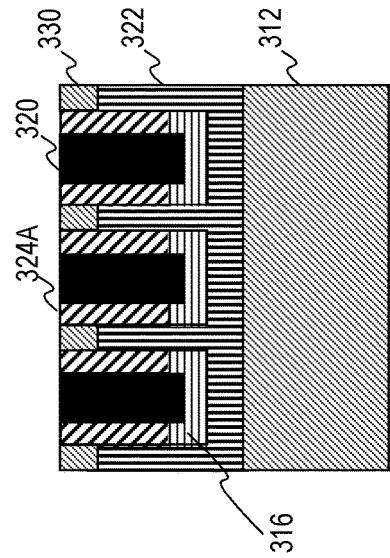

Referring to FIG. 3H, the method includes forming gate buses 320 in the second openings OP2. In an embodiment, an organic material (e.g., a photoresist) is formed over the resulting structure of FIG. 3G by a deposition method (e.g., spin coating), and portions of the organic material not in the second openings OP2 are removed, and the remaining portions of the organic material in the second openings OP2 are converted into a material (e.g., carbon) in the gate buses 320 by a heating process (e.g., pyrolysis).

Figure 3J:
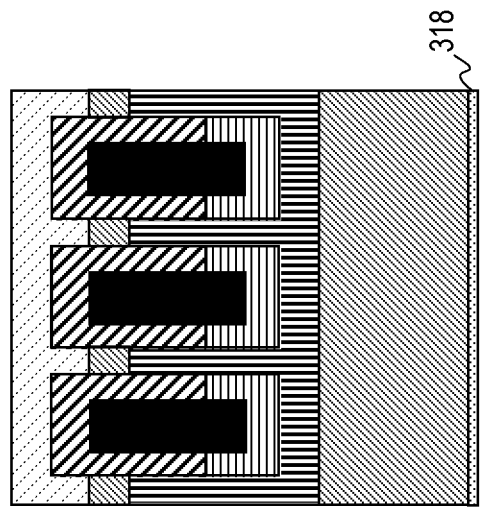
Figure 3I:
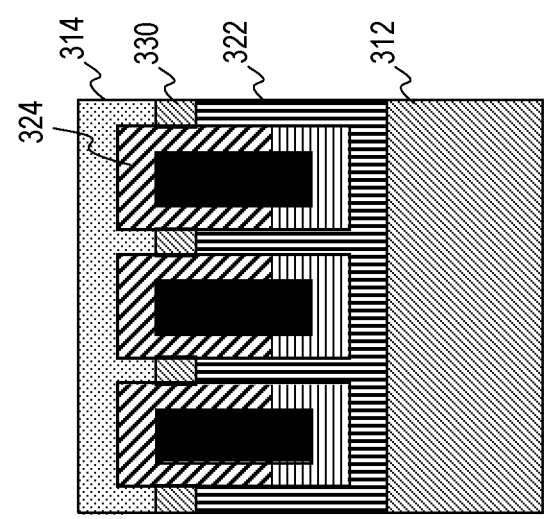

Referring to FIG. 3I, the method includes forming dielectric patterns 324 and an output electrode (e.g., a drain) 314 over the dielectric patterns 324. In an embodiment, additional dielectric is formed over the resulting structure of FIG. 3H, the additional dielectric is patterned to form the dielectric pattern 324 together with the dielectric materials 324A, and the drain 314 is formed over the dielectric patterns 324 and the doped patterns 330.

Referring to FIG. 3J, the method includes forming a conductive layer 318 at a bottom of the substrate 312. In an embodiment, the conductive layer 318 includes silicide (e.g., nickel silicide).

The method may further include forming an insulation layer (e.g., the insulation layer 132 in FIG. 1) over the drain 314. In an embodiment, the insulation layer includes Beryllium oxide (BeO).

The method may further include forming a first heatsink (e.g., the upper cooling plate 128 in FIG. 1) over the insulation layer and a second heatsink (e.g., the lower cooling plate 126 in FIG. 2) under the conductive layer 318. For example, the first heatsink, or the second heatsink, or both may include gold to withstand high operating temperatures (e.g., up to about 550° C.).

Figure 4B:
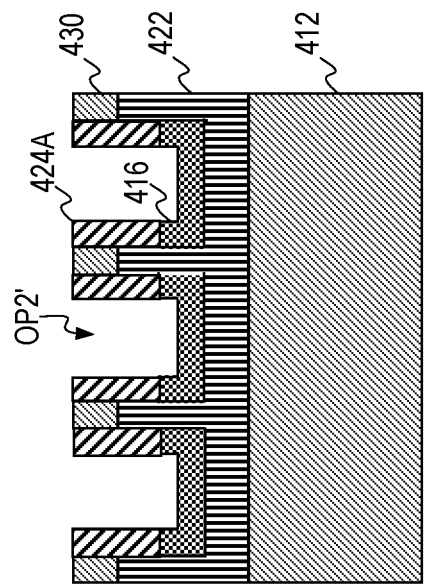
FIGS. 4A and 4B illustrate a method of fabricating the transistor device in FIG. 2 according to an embodiment.
Figure 4A:
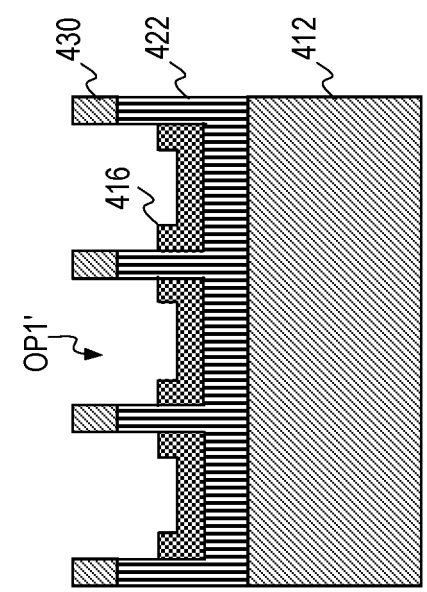

FIGS. 4A and 4B illustrate a method of fabricating the transistor device 210 in FIG. 2 according to an embodiment. Specifically, FIGS. 4A and 4B are simplified cross-sectional views of fabricating a middle portion (indicated by a dashed box in FIG. 2) of the transistor device 210. The method of fabricating the transistor device 210 in FIG. 2 includes similar processes to those of the method of fabricating the transistor device 110 of FIG. 1, and thus detailed descriptions on these processes may be omitted in the following descriptions for the interest of brevity.

Referring to FIG. 4A, the method includes forming Schottky barrier type gates 416 in first openings OP1' similar to the first openings OP1 of FIG. 3C. In an embodiment, a metal layer (e.g., TiW, Ti, or Pt) is formed over the structure including doped patterns 430 and an epitaxial pattern 422 similar to the structure of FIG. 3C, and the metal layer is selectively removed to form the Schottky barrier type gates (e.g., recessed Schottky gates) 416. For example, each of the recessed Schottky gates 416 may be formed between a pair of adjacent pillars of the epitaxial pattern 422.

Referring to FIG. 4B, the method includes forming dielectric materials 424A over the Schottky barrier-type gates 416 to form second openings OP2'. In the embodiment shown in FIG. 4B, the dielectric materials 424A are formed to make a size of the second opening OP2' substantially equal to that of a recessed portion of the Schottky barrier-type gates 416. After forming the dielectric materials 424A, gate buses may be formed in the second openings OP2' similarly to the processes described above with reference to FIG. 3H.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

The invention claimed is:

1. A silicon carbide (SiC) static induction transistor (SIT), comprising:
    a source disposed under a top surface of the transistor;
    a gate disposed over the source and configured to receive a control signal;
    a drain disposed over the gate and configured to generate an output signal;
    an epitaxial pattern disposed between the source and the drain and including a protruding portion; and
    a gate bus electrically coupled to the gate and including carbon.

2. The transistor of claim 1, wherein the source is grounded and includes dopants of a first conductivity type.

3. The transistor of claim 1, wherein the gate is a recessed gate, and the recessed gate includes P-type dopants.

4. The transistor of claim 3, further comprising a drain contact disposed between the protruding portion of the epitaxial pattern and the drain.

5. The transistor of claim 4, wherein the gate bus extends from the recessed gate beyond a bottom surface of the drain contact.

6. The transistor of claim 1, wherein the gate is a Schottky barrier type gate.

7. The transistor of claim 6, wherein the gate is a recessed gate, and the recessed gate includes any one selected from the group of consisting of TiW, Ti, and Pt.

8. A silicon carbide (SiC) static induction transistor (SIT) device, comprising:
    a first heatsink; and
    a die disposed under the first heatsink and including:
        a source disposed under a top surface of the transistor device;
        a recessed gate disposed over the source and configured to receive a control signal;
        a drain disposed over the recessed gate and configured to generate an output signal;
        an epitaxial pattern disposed between the source and the drain and including a protruding portion; and a gate bus electrically coupled to the gate and including carbon.

9. The transistor device of claim 8, further comprising a second heat sink over which the die is disposed.

10. The transistor device of claim 9, wherein the first heatsink covers a top surface and side surfaces of the die, and the second heatsink covers a bottom surface of the die.

11. The transistor device of claim 8, wherein the source is grounded and includes dopants of a first conductivity type.

12. The transistor device of claim 8, wherein the gate is a recessed gate, and the recessed gate includes P-type dopants, and
wherein the first heatsink and the second heat sink include gold (Au).

13. The transistor device of claim 12, further comprising a drain contact disposed between the protruding portion of the epitaxial pattern and the drain,
wherein the gate bus extends from the recessed gate beyond a bottom surface of the drain contact.

14. The transistor device of claim 8, wherein the gate is a Schottky barrier type gate.

15. A method of forming a silicon carbide (SiC) static induction transistor (SIT) device, comprising:
providing a substrate including a source that is doped with dopants of a first conductivity type;
forming an epitaxial pattern including a protruding portion over the source;
forming a recessed gate over the source;
forming a gate bus over the recessed gate;
forming a drain over the gate bus and the epitaxial pattern; and
forming a first heatsink over the drain.

16. The method of claim 15, further comprising forming a dielectric material over a sidewall of the protruding portion of the epitaxial pattern,
wherein forming the gate bus includes:
depositing the organic material over the recessed gate and the dielectric material;
removing a portion of the deposited organic material; and
converting the remaining portion of the deposited organic material into carbon.

17. The method of claim 16, wherein the organic material is a photoresist.

18. The method of claim 15, further comprising forming a drain contact over the protruding portion of the epitaxial pattern,
wherein the gate bus is formed to extend from the recessed gate beyond a bottom surface of the drain contact.

19. The method of claim 15, wherein the protruding portion of the epitaxial pattern is a first protruding portion, and the epitaxial pattern further includes a second protruding portion disposed adjacent to the first protruding portion, and
wherein forming the recessed gate includes implanting dopants of a second conductivity type into a region between the first and second protruding portions of the epitaxial pattern.

20. The method of claim 15, wherein the protruding portion of the epitaxial pattern is a first protruding portion, and the epitaxial pattern further includes a second protruding portion disposed adjacent to the first protruding portion, and
wherein forming the recessed gate includes:
depositing a metal layer over the epitaxial pattern; and
removing a portion of the metal layer to form the recessed gate between the first and second protruding portions of the epitaxial pattern.

\* \* \* \* \*